US005667399A

United States Patent [19]
Jackson et al.

[11] Patent Number: 5,667,399
[45] Date of Patent: Sep. 16, 1997

[54] METHOD AND APPARATUS FOR MODULAR COMPONENT SYSTEM FOR EFFICIENT ADDITION OF PERIPHERAL COMPONENTS

[75] Inventors: Richard C. Jackson, San Jose; Raymond W. Riley, Santa Cruz; David Laituri, Palo Alto; Bob Clary, Concord, all of Calif.

[73] Assignee: Apple Computer, Inc., Cupertino, Calif.

[21] Appl. No.: 543,206

[22] Filed: Oct. 13, 1995

[51] Int. Cl.⁶ ........................................................ H01R 4/50
[52] U.S. Cl. ............................................. 439/341; 439/928
[58] Field of Search ........................... 439/341, 345, 439/350, 352, 358, 378, 928; 361/728, 801–802

[56] References Cited

U.S. PATENT DOCUMENTS

| | | | |
|---|---|---|---|
| 4,969,830 | 11/1990 | Daly et al. | 439/928 X |
| 4,972,296 | 11/1990 | Chu | 439/341 X |
| 5,148,353 | 9/1992 | Morgan et al. | 439/341 X |
| 5,306,174 | 4/1994 | Kiga | 439/376 X |
| 5,415,561 | 5/1995 | Marvin et al. | 439/341 |
| 5,486,982 | 1/1996 | Hsu | 361/728 |
| 5,516,136 | 5/1996 | Matthews et al. | 439/341 X |

Primary Examiner—Khiem Nguyen
Attorney, Agent, or Firm—David J. Larwood

[57] ABSTRACT

The present invention includes methods and apparatus for efficiently coupling an additional component to an electronic device. The invention is particularly useful in conjunction with modular electronic devices. An additional component may be mechanically and electrically coupled to a video electronic device. The added component is joined to the electronic device by a series of easy steps which include bringing the front bottom surface of the electronic device into contact with the front top surface of the added component and then rotating the rear surface of the electronic device, such that the front bottom surface of the electronic device is flush with the front top surface of the added component. The electronic device and added component include feet and receptors respectively that allow them to be easily aligned. Finally, the added component and electronic device are securely joined by a latch. Since the device and component are integral, the added device does not require a large amount of space. To avoid routing wires separately to the added component, the added component is internally electrically coupled to the original device through a card and slot mechanism. The device and component are also electromagnetically coupled so that they share common electromagnetic shielding.

18 Claims, 4 Drawing Sheets

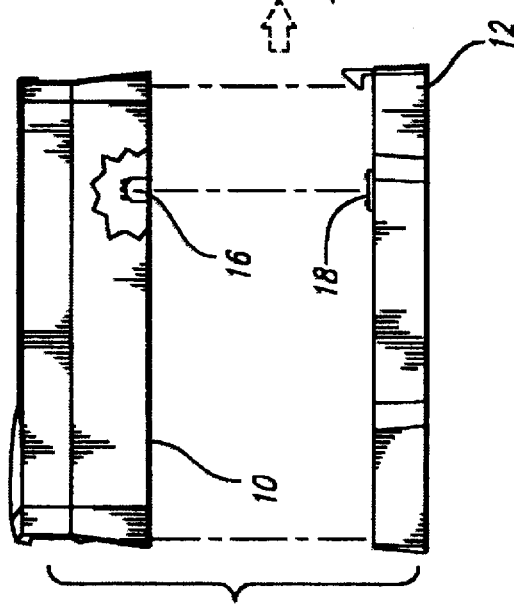
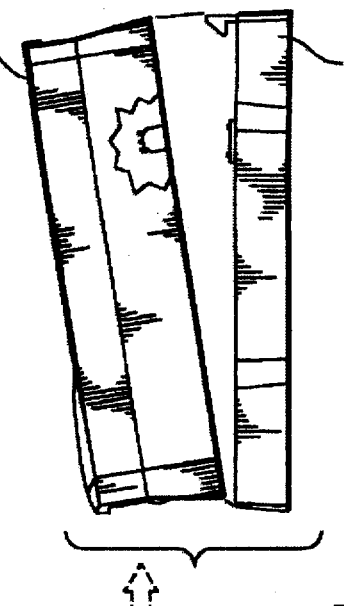
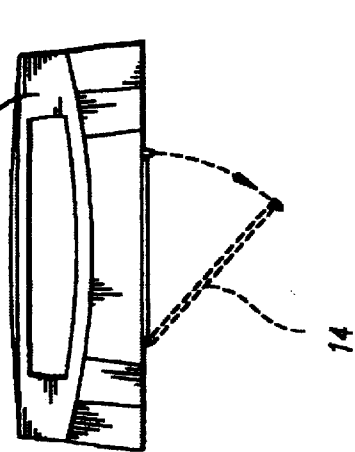
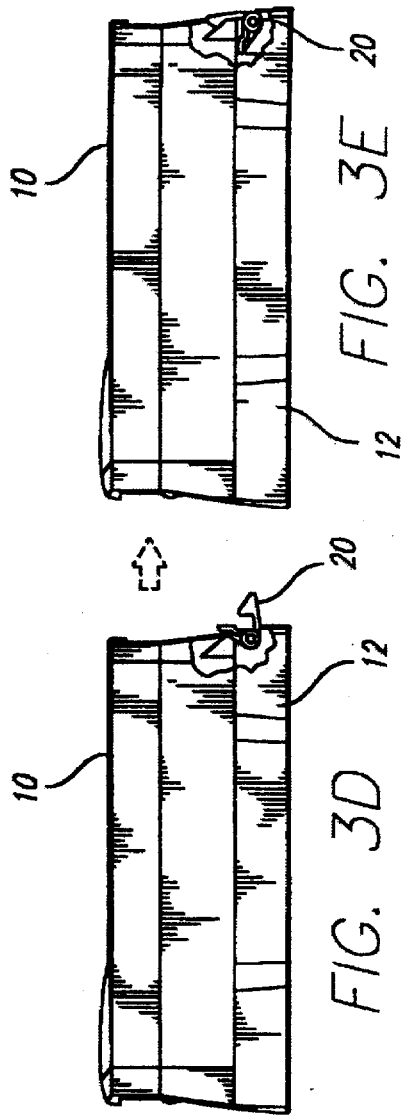

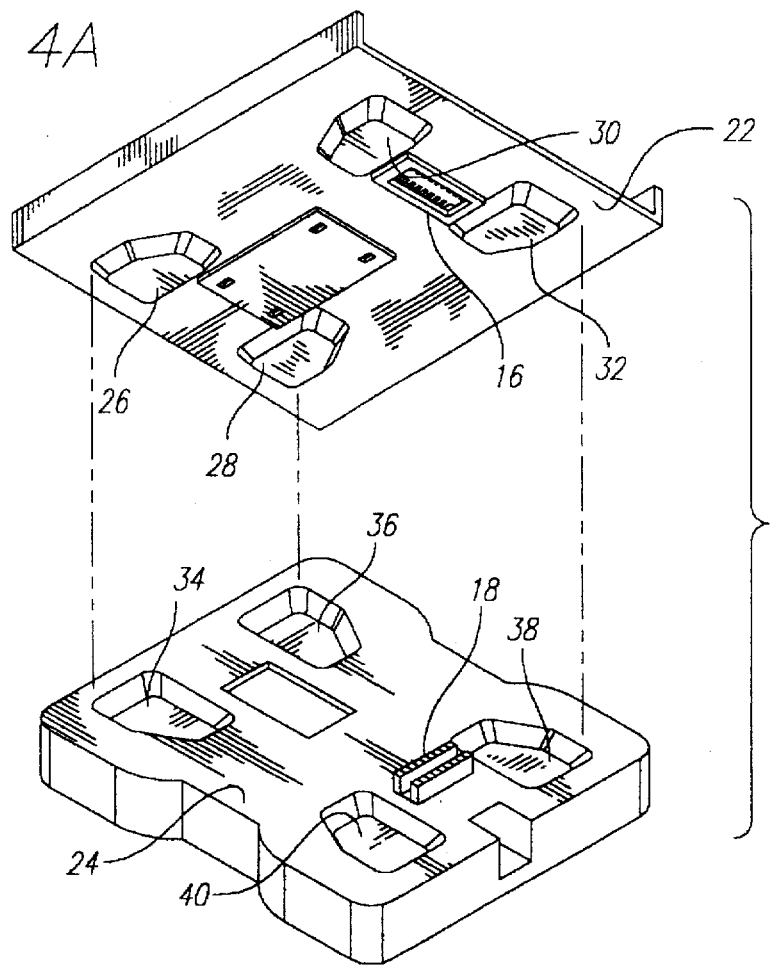
FIG. 4A
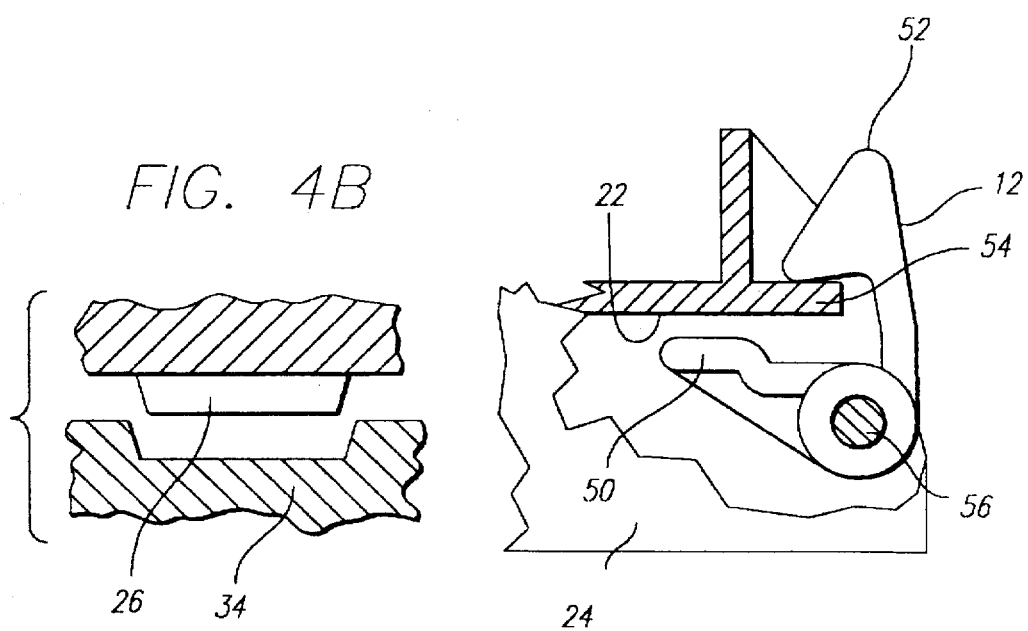
FIG. 4B
FIG. 5

METHOD AND APPARATUS FOR MODULAR COMPONENT SYSTEM FOR EFFICIENT ADDITION OF PERIPHERAL COMPONENTS

BACKGROUND OF THE INVENTION

1. Field of the Invention

The present invention relates to electronic equipment and, more specifically, to a modular component system that permits additional peripheral components to be efficiently added.

2. Art Background

Electronic equipment such as computers, stereos, multimedia game players and other home entertainment devices is ubiquitous in the modern household. Frequently, a consumer will purchase an electronic device and, at a later date, desire to add additional components to the device. Quite simply, current electronic devices do not provide a convenient mechanism for interfacing an additional module or modules.

Thus, there is a need for a system that allows additional components to be added to an electronic device. Optimally, the consumer should be able to add the additional component easily, inexpensively and without wasting space and requiring an additional tangle of wires. The present invention fulfills this need by providing a modular component system.

SUMMARY OF THE INVENTION

The present invention includes methods and apparatus for efficiently coupling an additional component to an electronic device. The invention is particularly useful in conjunction with modular electronic devices. An additional component may be mechanically and electrically coupled to the electronic device. The added component is joined to the electronic device by a series of easy steps which include bringing the front bottom surface of the electronic device into contact with the front top surface of the added component and then rotating the rear surface of the electronic device, such that the front bottom surface of the electronic device is flush with the front top surface of the added component. The electronic device and added component include feet and receptors respectively that allow them to be easily aligned. Finally, the added component and electronic device are securely joined by a latch. Since the device and component are integral, the added device does not require a large amount of space. To avoid routing wires separately to the added component, the added component is internally electrically coupled to the original device through a card and slot mechanism. The device and component are also electromagnetically coupled so that they share common electromagnetic shielding. These and other features of the present invention will be apparent from the following description.

BRIEF DESCRIPTION OF THE DRAWINGS

The objects, features and advantages of the present invention will be apparent from the following detailed description of the preferred embodiment of the invention with references to the drawings in which:

FIGS. 3a, 3b, 3c, 3d, 3e show a sequence of the steps of the present invention to couple the electronic device with the additional component.

FIG. 4a illustrates a bottom surface of the electronic device and a top surface of the additional component.

FIG. 4b is an exaggerated view of the coupling between the foot and the receptor.

FIG. 5 is an illustration of a latch that couples the electronic device with the additional component.

DETAILED DESCRIPTION OF THE INVENTION

The present invention discloses a housing system for an electronic device and additional components. In the following description, numerous specific details are set forth in order to provide a thorough understanding of the present invention. However, it will be apparent to one skilled in the art that the present invention may be practiced without these specific details. In other instances, well-known circuits, structures, and the like are not described in detail so as not to obscure the present invention unnecessarily. Moreover, although the present invention is described with reference to an electronic device, it will be appreciated that the invention has application to many other devices where an electronic device must be mechanically and electrically coupled to additional components. Accordingly, the specific reference to a video game player in this Specification is not to be understood as a limitation in the application of the invention.

Figure 1:
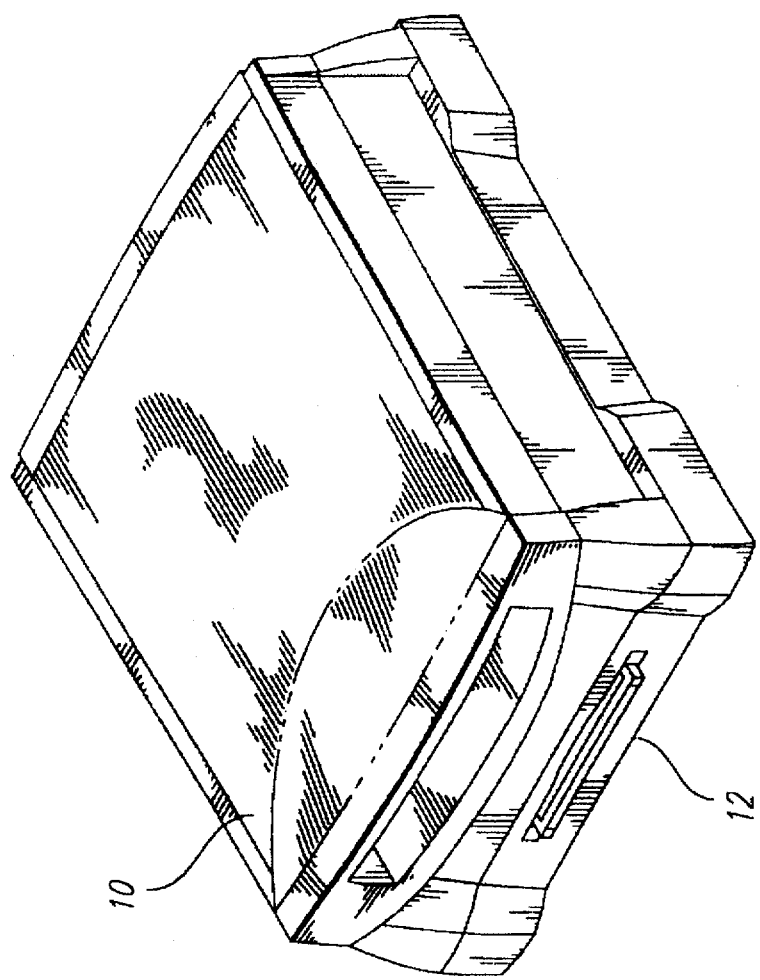
FIG. 1 is an illustration of an electronic device, a video game player, and an additional component, that are integrally coupled according to the methods and apparatus of the present invention.

FIG. 1 is an illustration of an integrated electronic system comprising an original electronic device, shown in the figure as a video game player 10, and an additional component 12, that are coupled according to the methods and apparatus of the present invention. Although specific devices are shown for the purposes of description, it will be appreciated that the present invention may be employed with any type of electronic device, including without limitation a personal computer or audio system, and any type of additional component. The video game player 10 is coupled to a display (or may include a display) (not shown) and is presumed to have been purchased by a consumer before the consumer has purchased the additional component 12, although the present invention is also useful when the video game 10 is purchased simultaneously with the additional component 12.

Figure 2:
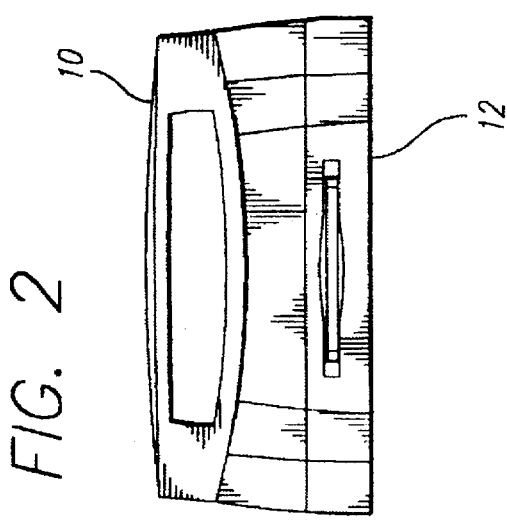
FIG. 2 is a front view of the integral system comprising the video game player and add on component of FIG. 1.

FIG. 1 further illustrates the addition of the additional component 12 to the consumer's system. As is evident from the figure, the additional component 12 is integral with the video game player 10, which minimizes the space occupied by the additional component 12 by obviating the need to position the additional component 12 apart from other additional components such as the video game player 10. In addition, as will be described more fully below, the additional component 12 is internally electrically coupled to the video game 10, and thus separate external wires need not be coupled to the additional component 12. FIG. 2 is a front view of the integral system comprising the video game player 10 and the additional component 12.

FIGS. 3a–3e illustrate the sequence of the steps required to couple the additional component 12 to the video game player 10. According to the to teachings of the present invention, as shown in the figures, the additional component 12 is added to the video game 10 by completing a number of very easy steps. The first step is illustrated in FIG. 3a, wherein a door 14 on the bottom of the video game player 10 is removed. Before the addition of any units to the video game player 10, the door serves to insulate the internal components of the video game player 10 from its surrounding environment. After the first step, the video game player 10 is placed vertically over the component to be added, which in the illustration is the additional component 12. As shown in FIG. 3b, the additional component 12 includes a slot 18. The slot 18 electrically couples the video game 10 to the additional component 12 through a card (not shown) mounted within a groove 16 included within the video game 10.

In the third step of the process shown in FIG. 3c, the front bottom of the video game player 10 is placed in contact with the front top of the additional component 12. The mounting mechanisms on the front bottom of the video game player 10 and the front top of the additional component 12 will be described more fully below. The rear bottom of the video game player 10 is placed above the rear top of the additional component 12, such that the bottom surface of the video game 10 forms an angle with the top surface of the additional component 12. The video game player 10 is then rotated toward the additional component 12, resulting in the bottom surface of the video game player 10 being flush with the top surface of the additional component 12, as illustrated in FIG. 3d. The rear of the bottom surface of the video game player 10 forces the lever portion of a latch 20 to pivot from a vertical position to a substantially horizontal position. To complete the assembly as shown in FIG. 3e, the latch 20 is pivoted counterclockwise to lock the video game player 10 with the additional component 12.

FIG. 4a illustrates the bottom surface 22 of the video game player 10 and the top surface 24 of the additional component 12. The bottom surface 22 includes four feet (extrusions) 26, 28, 30 and 32, that comprise indentations in the bottom surface 22 and extend below a plane defining the bottom surface 22. The feet 26, 28, 30 and 32 are received by a plurality of receptors 34, 36, 38 and 40 that comprise indentations on the top surface 24. FIG. 4b is an exaggerated view of the coupling between the foot 26 and the receptor 34. As previously described with reference to the steps of FIG. 3, the front of the bottom surface 22 is guided into its proper location relative to the top surface 24. As shown in FIG. 4a, this guiding is accomplished by sliding the feet 26 and 28 into the receptors 34 and 36. When the rear of the bottom surface 22 is then rotated and brought flush with the top surface 34, the foot 30 and 32 are received by the receptors 38 and 40.

FIG. 5 illustrates the latch 12. The latch 12 includes a lever portion 50 that lifts the bottom surface 22 when the latch 12 is rotated clockwise (as viewed in FIG. 5), which allows the video game player 10 to be easily separated from the floppy drive 12, which is particularly convenient since the card 18 and the slot 16 may require a particular amount of force to be separated. To engage the video game player 10, the latch 12 includes a hook portion 52 to couple with a flange 54 on the top of the bottom surface 22. The latch rotates about pivot pin 56.

Figure 6:
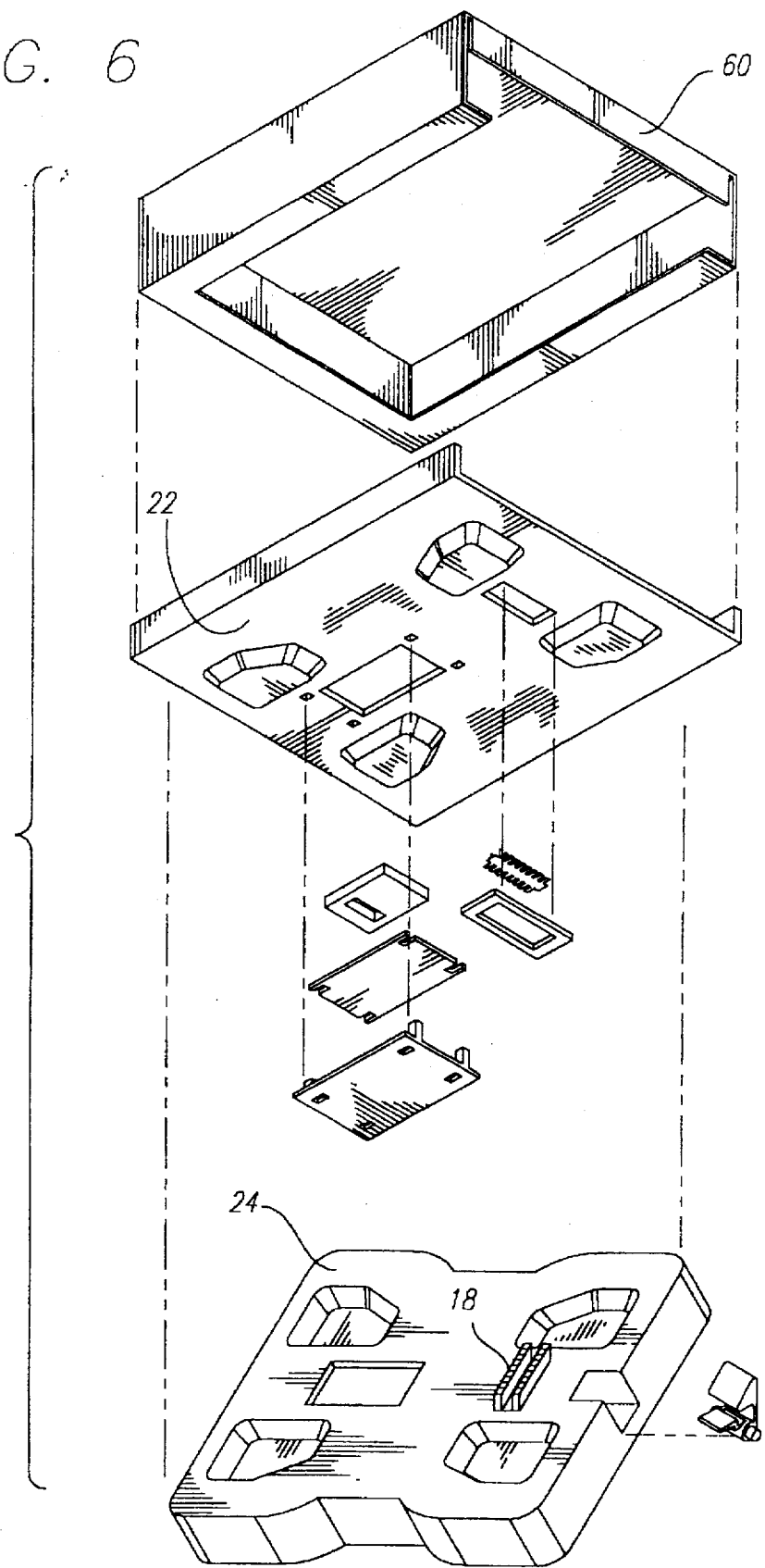
FIG. 6 is a more detailed illustration of the electronic device and additional component.

FIG. 6 is a more detailed illustration of the video game player 10 and the top surface 24 of the additional component 12. The video game player 10 comprises a metal chassis 60 that provides electromagnetic shielding for the electronic circuits within the video game player 10. A unique feature of the present invention allows the shielding provided by the metal chassis 60 to be coupled to the shielding of the added peripheral, such as the additional component 12. The electromagnetic coupling of the peripherals' respective shields provides enhanced protection. The electromagnetic coupling of the respective shields is achieved through the use of the slot 18. In addition to providing electrical coupling for information and other data signals through a card, the slot 18 includes metal fingers that are coupled to the shielding of the additional component 12. The metal fingers engage corresponding teeth on the metal chassis disposed near the bottom surface 22 of the video game player 10 that form a conductive path between the metal fingers and the chassis 60.

Although the present invention has been described in terms of a preferred embodiment and with reference to FIGS. 1–6, it will be appreciated that various modifications and alterations might be made by those skilled in the art without departing from the spirit and scope of the invention. For example, the additional component 12 may be configured such that an additional peripheral may be added to it and further peripherals may be added in a similar fashion to create an integral system of peripherals. Further, the teachings of the present invention may be employed with personal computer peripherals in addition the electronic devices. The invention should therefore be measured in terms of the claims which follow.

We claim:

1. A primary component comprising:
   a housing, said housing further comprising a substantially planar surface, said planar surface including mounts for receiving a secondary component;
   a latch rotatably coupled to a rear part of said primary component, said latch for engaging a flange on said secondary component, said latch further comprising a lever portion for lifting said secondary component away from said primary component, and
   a coupler disposed at least in part along said planar surface for providing an electrical interface between said first and said secondary components, said coupler comprising part of a card assembly.

2. The primary component of claim 1 wherein said substantially planar surface comprises a bottom surface of said primary component.

3. The primary component of claim 1 wherein said substantially planar surface comprises a top surface of said primary component.

4. The primary component of claim 1 wherein said coupler comprises a slot defined by spring loaded teeth, said slot for receiving a card and said teeth for providing a conductive path between said secondary component and a chassis comprising said secondary component.

5. The primary component of claim 1 wherein said mounts comprise a plurality of indentations in said planar surface for receiving corresponding extrusions on a surface of said secondary component.

6. The primary component of claim 1 wherein said mounts comprise a plurality of extrusions in said planar surface for fitting into corresponding indentations on a surface of said secondary component.

7. The primary component of claim 1 wherein said primary component comprises a video game player.

8. The primary component of claim 1 wherein said primary component comprises an additional component for a video game player.

9. A primary component that may be added to a secondary component to create an integrated unit, said primary component comprising:
   a housing, said housing further including a substantially planar surface, said planar surface including mounts for receiving a secondary component, said secondary component including a chassis;
   a latch rotatably coupled to a rear part of said primary component, said latch for engaging a flange on said secondary component, said latch further comprising a lever portion for lifting said secondary component away from said primary component; and a coupler for electrically coupling said primary component to said chassis of said secondary component to provide a common electromagnetic shield for said primary and secondary components.

10. The primary component of claim 9 wherein said substantially planar surface comprises a bottom surface of said primary component.

11. The primary component of claim 9 wherein said substantially planar surface comprises a top surface of said primary component.

12. The primary component of claim 9 wherein said coupler includes a slot defined by spring loaded teeth, said slot disposed along said substantially planar surface, said slot for receiving a card and said teeth for providing a conductive path between said primary component and a chassis comprising said secondary component.

13. The primary component of claim 9 wherein said mounts comprise a plurality of indentations in said planar surface for receiving corresponding extrusions on a surface of said secondary component.

14. The primary component of claim 9 wherein said mounts comprise a plurality of extrusions in said planar surface for fitting into corresponding indentations on a surface of said secondary component.

15. A method for coupling primary and secondary components, said primary and secondary components each having a surface for mating with a surface of the other component, each said surface having a front and a rear part, said method comprising the steps of:

bringing the front of said surfaces into contact while holding the rear of said primary component surface at an angle with the rear of said secondary component surface;

rotating a latch on said secondary component to couple with a flange on said primary component, said latch including a lever portion for lifting said secondary component away from said primary component when reversing the coupling method in a corresponding decoupling method; and rotating the rear of said primary component surface to bring it into contact with the rear of said secondary component surface, said rotation also causing said primary and secondary components to be electrically coupled through a coupler, said coupler disposed along at least one of said surfaces at a location sufficiently distant from the front of said surfaces to allow said components to be easily coupled.

16. The method of claim 15 wherein said step of bringing the front of said surfaces into contact further comprises the step of sliding the front of said primary component surface along said secondary component surface until indentations within said front of said primary component surface are received by corresponding indentations within said front of said secondary component surface.

17. The method of claim 16 wherein said primary component surface comprises a bottom surface and said secondary component surface comprises a top surface such that said components, when joined, form an integral vertical structure.

18. The method of claim 15 further comprising decoupling said primary and secondary units by rotating said latch, bringing said lever into contact and engaging with said secondary unit and, upon further rotation of said latch, pushing said secondary unit away from said primary unit, facilitating complete decoupling of said primary and secondary units.

* * * * *